United States Patent
Tsai

(10) Patent No.: US 9,518,884 B2
(45) Date of Patent: Dec. 13, 2016

(54) MICRO-ELECTRO-MECHANICAL DEVICE AND METHOD FOR MAKING THE SAME

(71) Applicant: Ming-Han Tsai, Hsin-Chu (TW)

(72) Inventor: Ming-Han Tsai, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 216 days.

(21) Appl. No.: 14/049,850

(22) Filed: Oct. 9, 2013

(65) Prior Publication Data

US 2014/0109680 A1 Apr. 24, 2014

(30) Foreign Application Priority Data

Oct. 22, 2012 (TW) .............................. 101138845 A

(51) Int. Cl.
| | | |
|---|---|---|
| *G01L 11/04* | (2006.01) | |
| *G01L 9/00* | (2006.01) | |
| *B81B 3/00* | (2006.01) | |
| *H04R 19/00* | (2006.01) | |

(52) U.S. Cl.
CPC ................ *G01L 11/04* (2013.01); *B81B 3/007* (2013.01); *G01L 9/0072* (2013.01); *H04R 19/00* (2013.01); *H04R 19/005* (2013.01); *B81B 2201/0257* (2013.01); *H04R 2201/003* (2013.01)

(58) Field of Classification Search
CPC ...... B81B 3/007; B81B 3/0097; B81B 3/0064; B81B 3/0086
See application file for complete search history.

(56) References Cited

U.S. PATENT DOCUMENTS

| | | |
|---|---|---|
| 6,535,460 B2 | 3/2003 | Loeppert et al. |
| 7,961,897 B2 * | 6/2011 | Weigold ................ G01L 9/0042 381/174 |
| 8,003,422 B2 | 8/2011 | Lee et al. |
| 2007/0058825 A1 * | 3/2007 | Suzuki ................... H04R 19/04 381/174 |
| 2007/0064968 A1 | 3/2007 | Weigold |
| 2010/0212432 A1 * | 8/2010 | Kasai ................... H04R 19/005 73/654 |
| 2010/0330722 A1 * | 12/2010 | Hsieh .................. B81C 1/00246 438/53 |
| 2015/0078590 A1 * | 3/2015 | Daley .................... B81B 3/007 381/190 |
| 2015/0110309 A1 * | 4/2015 | Park ..................... H04R 19/005 381/190 |

\* cited by examiner

*Primary Examiner* — Robert Huber
*Assistant Examiner* — Herbert K Roberts
(74) *Attorney, Agent, or Firm* — Tung & Associates

(57) ABSTRACT

The invention provides a micro-electro-mechanical device which includes a substrate, an electrode, and a diaphragm. The electrode includes plural vent holes. The diaphragm is disposed above and in parallel to the electrode, to form a capacitive sensor with the electrode. The diaphragm includes plural ribs protruding upward and/or downward from the diaphragm; the ribs are respectively disposed in correspondence to the plural vent holes and do not overlap nor contact the electrode. A method for making the micro-electro-mechanical device is also provided according to the present invention.

18 Claims, 5 Drawing Sheets

MICRO-ELECTRO-MECHANICAL DEVICE AND METHOD FOR MAKING THE SAME

CROSS REFERENCE

The present invention claims priority to TW 101138845, filed on Oct. 22, 2012.

BACKGROUND OF THE INVENTION

Field of Invention

The present invention relates to a micro-electro-mechanical device, especially a micro-electro-mechanical device which includes a plurality of ribs on (or under) a diaphragm for improving the flatness of the diaphragm, to provide a better acoustic pressure sensing capability.

Description of Related Art

Because of small size, high sensitivity, and low power consumption, micro-electro-mechanical devices are commonly used in daily life applications such as game joystick, automobile control system, and electronic products. FIG. 1 shows a cross-section view of a prior art micro-electro-mechanical device 10. The micro-electro-mechanical device 10 is for example a capacitive micro-electro-mechanical microphone which includes a substrate 11, an electrode 12, a spacer 13, and a diaphragm 14 which vibrates in response to an external acoustic pressure. The diaphragm 14 and the electrode 12 are arranged in parallel to form a capacitor whose capacitance changes according to the vibration of the diaphragm 14, so that the volume and frequency of the received sound can be sensed and determined. However, in manufacturing the micro-electro-mechanical device 10, the manufacturing steps such as deposition, sputter, baking an annealing will cause the micro-electro-mechanical device 10 to suffer great temperature variations which easily cause the diaphragm 14 to warp due to stress release. In addition, in order to improve sensing sensitivity, the diaphragm 14 preferably has a large area and thin thickness to enhance the signal output; however, this will cause more severe warpage problem. The warpage will increase the stiffness of the diaphragm 14 to affect the frequency response and weaken the vibration capability of the diaphragm 14.

Therefore, it is desired to reduce the warpage so that the diaphragm is more responsive to acoustic pressure.

SUMMARY OF THE INVENTION

In one aspect, the present invention provides a micro-electro-mechanical device which includes a substrate; an electrode including plural vent holes; and a diaphragm disposed above and in parallel to the electrode, to form a capacitive sensor with the electrode. The diaphragm includes plural ribs protruding upward and/or downward from the diaphragm; the ribs are respectively disposed in correspondence to the plural vent holes, wherein the ribs do not contact the electrode and do not overlap the electrode from top view.

According to one preferable embodiment of the present invention, the ribs are made of a conductive material such as metal, metallic compound, conductive polymer, polysilicon, or a combination thereof. In another embodiment, at least one of the ribs includes at least one via layer and a metal layer. In yet another embodiment, the via layer includes an internal space which is a hollow space or filled with a dielectric material.

In another preferable embodiment of the present invention, at least one of the ribs includes a bottom opening or a top opening.

In a preferable embodiment of the present invention, the layout of the ribs near a center region of the diaphragm has a relatively higher density than the layout of the ribs near a peripheral region of the diaphragm.

In a preferable embodiment of the present invention, the vent holes near a center region of the electrode have a relatively larger size than the vent holes near a peripheral region of the electrode.

In another preferable embodiment of the present invention, the micro-electro-mechanical device further includes a spacer to define an area of the diaphragm; and a supporting ring encompassing the diaphragm and disposed between a periphery of the diaphragm edge and the spacer.

In a preferable embodiment of the present invention, the supporting ring encompasses the diaphragm in a continuous form or the supporting ring encompasses the diaphragm with regular or irregular intervals.

The present invention also provides a method of making a micro-electro-mechanical device, which includes: providing a substrate; forming an electrode on or above the substrate and a plurality of vent holes in the electrode; forming a spacer on the substrate; and forming a diaphragm connected to the spacer to form a capacitor with the electrode, and forming a plurality of ribs protruding upward and/or downward from the diaphragm which are respectively disposed in correspondence to the vent holes, wherein the ribs do not contact the electrode and do not overlap the electrode from top view.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 1:
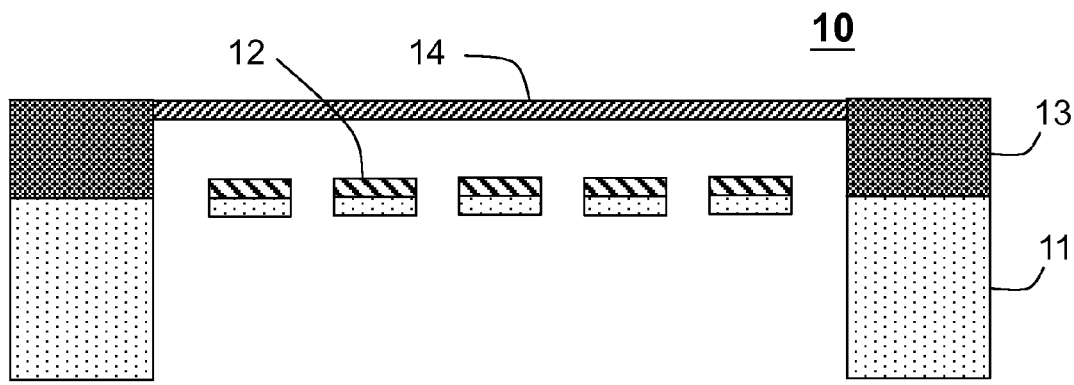
FIG. 1 shows a cross-section view of a prior art micro-electro-mechanical device.
Figure 2:
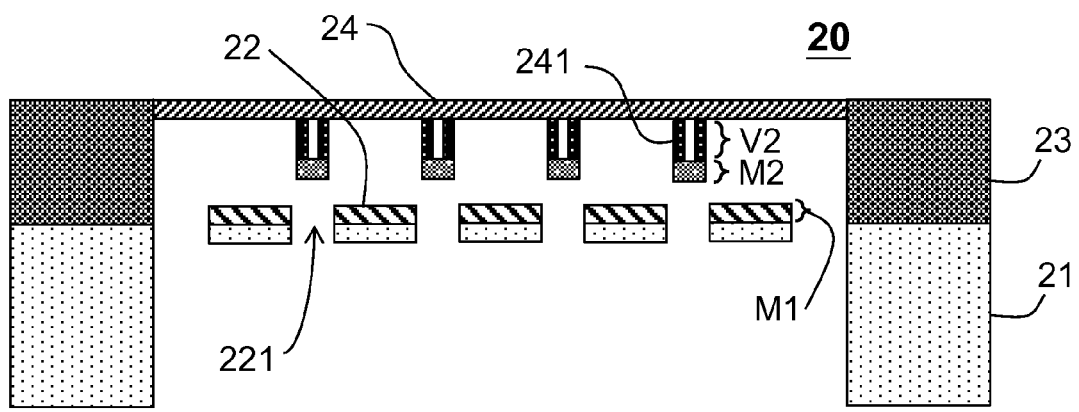
FIG. 2 shows a cross-section view of a preferable embodiment of the micro-electro-mechanical device according to the present invention.
Figure 3:
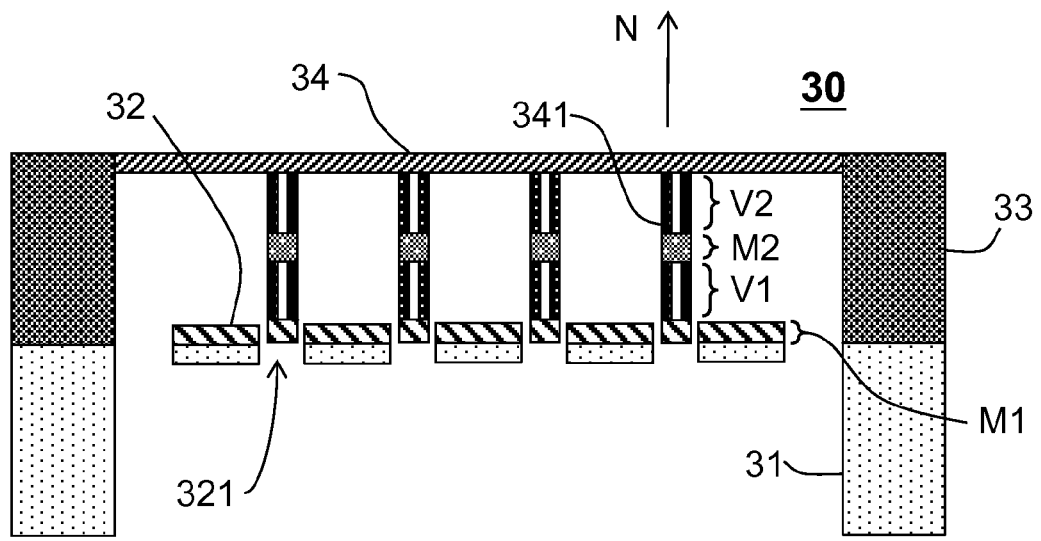
FIG. 3 shows a cross-section view of another preferable embodiment of the micro-electro-mechanical device according to the present invention.

Referring to FIG. 2, a cross-section view of an embodiment of the micro-electro-mechanical device 20 according to the present invention is shown. The micro-electro-mechanical device 20 includes at least one substrate 21, an electrode 22, and a diaphragm 24, wherein the electrode 22 includes plural vent holes 221. The diaphragm 24 is disposed above and in parallel to the electrode 22, to form a capacitive sensor with the electrode 22. The diaphragm 24 includes plural ribs 241 protruding from the diaphragm 24; the ribs 241 are disposed respectively corresponding to the vent holes 221 and do not contact the electrode 22. The electrode 22 can be formed by part of the substrate 21, or part of the metal layer M1, or part of the metal layer M1 and part of the substrate 21. FIG. 2 shows the embodiment that the electrode 22 is formed by part of the metal layer M1 and part of the substrate 21. When the diaphragm 24 receives an external acoustic pressure, the diaphragm 24 will vibrate in response to the amplitude (strength) and frequency of the external acoustic pressure. The distance between the electrode 22 and the diaphragm 24 varies in response to the vibration of the diaphragm 24, so the capacitance of the capacitor formed by the electrode 22 and the diaphragm 24 also varies in response to the vibration. The diaphragm 24 and the electrode 22 can be coupled to an external circuit, to transmit a capacitance variation signal representing the strength and frequency of the external acoustic pressure received by the micro-electro-mechanical device 20 to this external circuit. A spacer 23 is disposed on the substrate 21 to define the area of the diaphragm 24. The spacer 23 can be made of metal layers, or a combination of dielectric layers and metal layers, as desired. The ribs 241 are made of a combination of at least one via layer V2 and a metal layer M2; if it is desired (for increasing the capacitance or stiffness, etc.), more via layer and metal layer can be included. For example, as shown in FIG. 3, the rib can include a via layer V2, a metal layer M2, a via layer V1, a metal layer M1, etc. The number of via layers and metal layers is not limited in implementing the present invention. The metal layers M1 and M2 and the via layers V1 and V2 can be made of a material such as metal, metallic compound, conductive polymer, polysilicon, or a combination thereof, wherein the metal material can be Aluminum, Copper, Titanium, Tantalum, Tungsten, Molybdenum, etc. Besides, because the diaphragm 24 and the electrode 22 are to form a capacitor, it is preferred that the plural ribs 241 are disposed in correspondence to the plural vent holes 221 but do not contact the electrode 22; that is, from top view, the ribs do not overlap the electrode 22. The diaphragm 24 and the electrode 22 can be made of a conductive material such as metal, metallic compound, conductive polymer, polysilicon, or a combination thereof.

Referring to FIG. 3, a cross-section view of an preferable embodiment of the micro-electro-mechanical device according to the present invention is shown. The micro-electromechanical device 30 includes a substrate 31, an electrode 32, a spacer 33, and a diaphragm 34. The electrode 32 can be formed by part of the substrate 31, or part of the metal layer M1, or part of the substrate 31 and part of the metal layer M1. FIG. 3 shows the embodiment that the electrode 32 is formed by part of the metal layer M1 and part of the substrate 31. The diaphragm 34 includes plural ribs 341, and the electrode 32 includes plural vent holes; the ribs 341 do not contact the vent holes 321, that is, the ribs 341 do not overlap the vent holes 321 from top view. Viewing from a normal direction N, the plural ribs 341 are disposed inside the vent holes 321. This arrangement is to maintain a clearance between the ribs 341 and the capacitor formed between the electrode 32 and the diaphragm 34; another reason for this arrangement is that if the ribs 341 are formed by wet etch, the clearance prevents the wet etchant from sticking between the ribs 341 and the vent holes 321.

Figure 4:
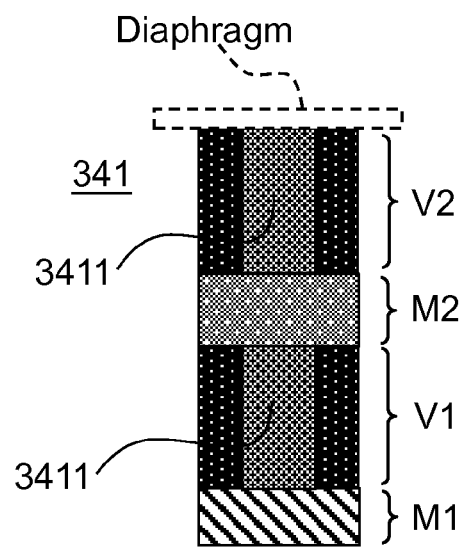
FIG. 4 shows a cross-section view of the rib according to a preferable embodiment of the present invention.

FIG. 4 shows a cross-section view of the ribs 341 which includes via layers V1 and V2 and metal layer M1 and M2. The via layers V1 and V2 include a conductive material such as metal, metallic compound, conductive polymer, or polysilicon, and an internal space enclosed by the conductive material. The internal space can be a hollow space or filled with a dielectric material (as shown by the label 3411); the dielectric material for example can be $SiO_2$、$Si_3N_4$、$TiO_2$、$Al_2O_3$、$HfO_2$, or polymer. Whether the internal space is designed as a hollow space or filled with a dielectric material can be determined according to manufacturing requirement, stiffness and mass of the diaphragm, capacitance between the diaphragm and the electrode, vibration characteristics of the diaphragm in response to the acoustic pressure. Of course, the ribs 341 also can be made completely of a conductive material such as metal, metallic compound, conductive polymer, polysilicon or a combination thereof.

Figure 5:
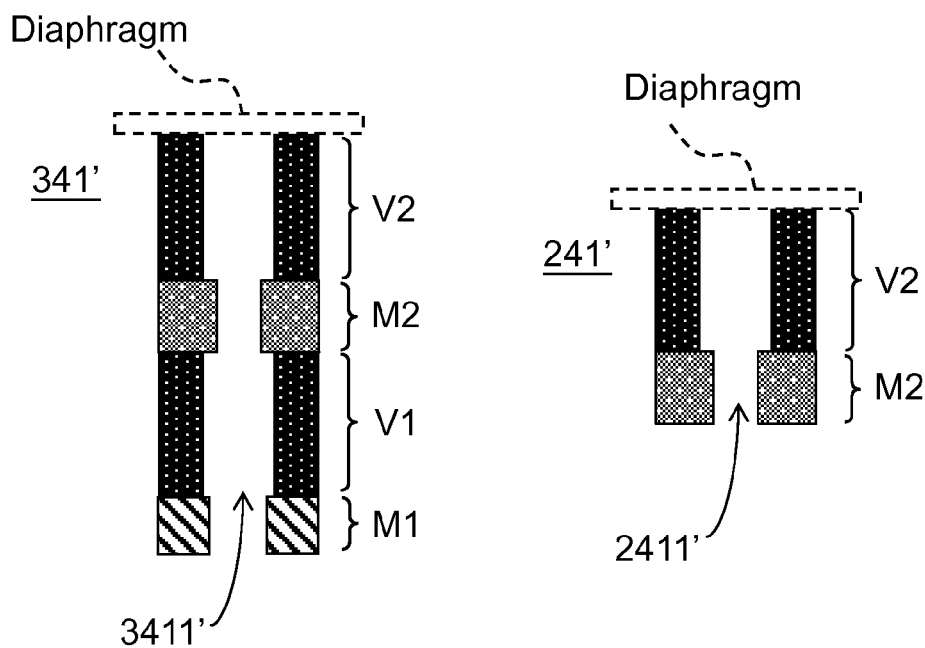
FIG. 5 shows cross-section views of the ribs according to two other preferable embodiments of the present invention.

FIG. 5 shows cross-section views of two embodiments of the ribs according to the present invention. The ribs 241' includes a via layer V2, a metal layer M2, and a bottom opening 2411' through the via layer V2 and the metal layer M2. The ribs 341' includes two via layers V1 and V2, two metal layers M1 and M2, and a bottom opening 3411' through the via layers V1 and V2 and the metal layers M1 and M2. Whether to provide such opening and the size and other design of the opening can be determined according to manufacturing requirement, stiffness and mass of the diaphragm, capacitance between the diaphragm and the electrode, and vibration characteristics of the diaphragm in response to the acoustic pressure.

The locations of the ribs on the bottom of the diaphragm can be arranged in any arbitrary form; for example, the ribs can be evenly arranged such as in a radial form, a chessboard form, etc. In a preferable embodiment of the present invention, the ribs near the center region have a higher density and the ribs near the peripheral region have a lower density, for the reason that: when the diaphragm vibrates in response to the external acoustic pressure, the vibration amplitude of the diaphragm near the center region is larger than the vibration amplitude near the peripheral region, and the air required to pass through the vent holes near the center region is more than the air required to pass through the vent holes near the peripheral region; therefore, if each vent hole has a similar size, then the vent holes near the center region preferably have a higher density and the vent holes near the peripheral region. In another embodiment of the present invention, the vent holes near the center region have larger sizes and the vent holes near the peripheral region have smaller sizes, to achieve the same effect as the aforementioned embodiment. Surely, the present invention is not limited to above embodiments; for example, the above embodiments can be implemented in combination.

Figure 6:
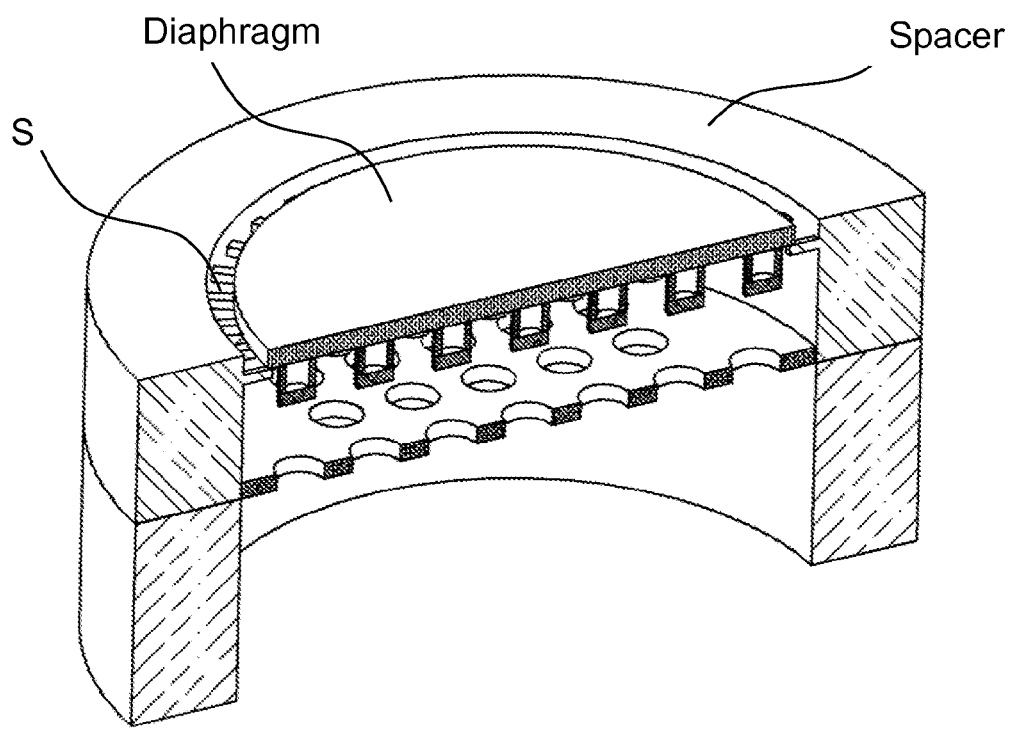
FIG. 6 shows a 3D cross-section view of a preferable embodiment according to the present invention.

FIG. 6 shows a 3D cross-section view of a preferable embodiment of the micro-electro-mechanical device according to the present invention. A supporting ring S encompasses the periphery of the diaphragm and is disposed between the diaphragm periphery and the spacer. In one embodiment, the supporting ring S can be provided in continuous form encompassing the diaphragm periphery, or in the present embodiment as shown by the figure, the supporting ring encompasses the diaphragm periphery by regular or irregular intervals (the supporting ring S has slots arranged by regular or irregular pitches). The supporting ring S is provided to adjust the stiffness of the diaphragm (so that the diaphragm has a desired flexibility) and the sensitivity of the diaphragm to generate the capacitance variation signal.

Figure 7:
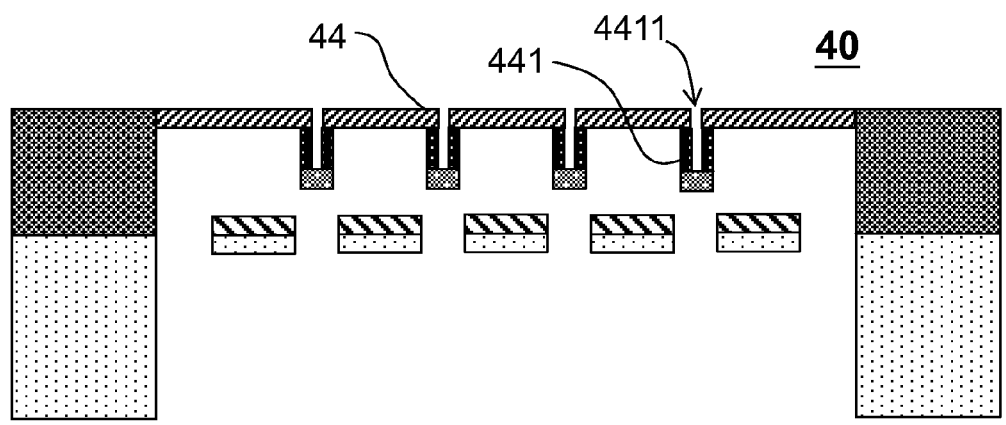
FIG. 7 shows a cross-section view of another preferable embodiment according to the present invention.

FIG. 7 shows another embodiment of the micro-electro-mechanical device 40. The micro-electro-mechanical device 40 includes a diaphragm 44 with plural ribs 441, and at least one of the ribs 441 includes a top opening 4411 through at least one via layer. The top opening 4411 can assist releasing inner stress of the diaphragm 44 to reduce the likelihood of warpage of the diaphragm 44.

Figure 8:
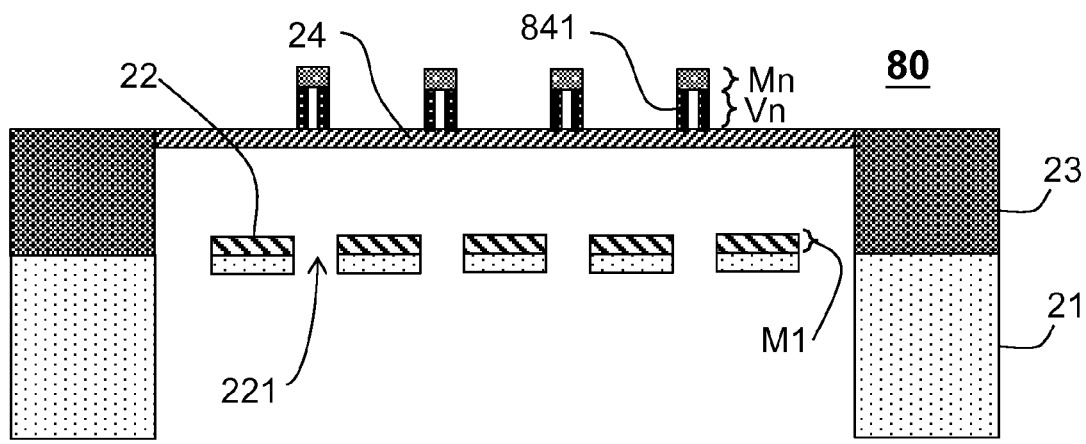
FIG. 8 shows a cross-section view of another preferable embodiment according to the present invention.

FIG. 8 shows another embodiment of the micro-electro-mechanical device 80. This embodiment is different from the embodiment of FIG. 2 in that: the micro-electro-mechanical device 80 includes plural ribs 481 protruding upward from the diaphragm 24, each rib 841 for example include at least one via layer Vn and a metal layer Mn ("n" indicates that the via layer Vn and the metal layer Mn can be any layer above the first metal layer M1 and not limited to the next adjacent via layer and the next adjacent metal layer). This embodiment shows that the ribs can protrude upward. The embodiments of FIGS. 2 and 8 can be implemented in combination, i.e., the diaphragm can be provided with ribs protruding both upward and downward. Therefore, by reciting "ribs protruding upward and/or downward", the scope of the claim should be interpreted to cover "ribs protruding both upward and downward" and "ribs protruding either upward or downward".

In addition, the rib of the embodiment of FIG. 8 can include more than one via layer or more than one metal layer, as referring to FIG. 3.

Figure 9:
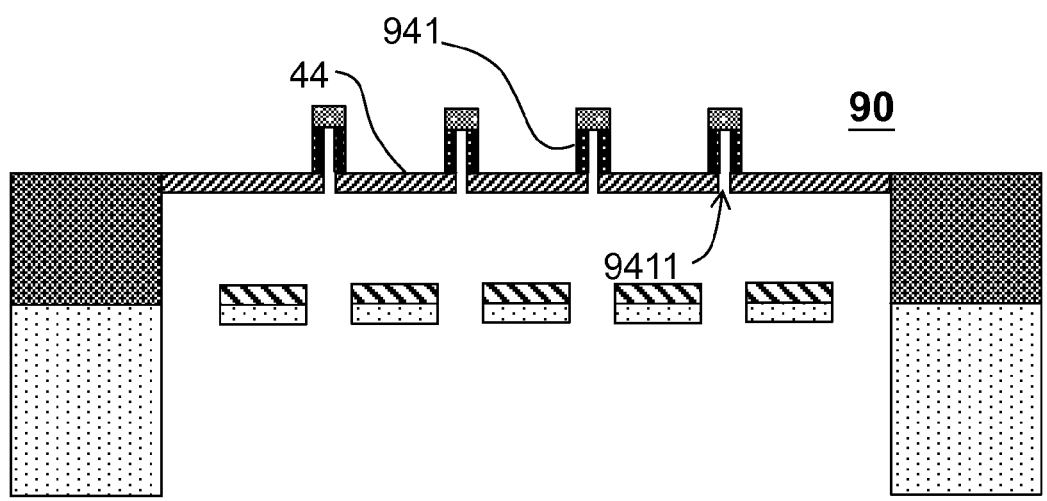
FIG. 9 shows a cross-section view of another preferable embodiment according to the present invention.

FIG. 9 shows another embodiment of a micro-electro-mechanical device 90. This embodiment is different from the embodiment of FIG. 7 in that: the micro-electro-mechanical device 90 includes plural ribs 941 protruding upward from the diaphragm 24, and each rib 941 included a bottom opening 9411. The ribs of this embodiment can also extend more upward from the diaphragm 24.

Referring to FIG. 5 in conjunction with FIG. 9, the rib of the embodiment of FIG. 9 can include more than one via layer or more than one metal layer, and the rib can also include top openings instead of the bottom opening 9411 (i.e., the structure shown in FIG. 5 is upside down). The embodiments of FIGS. 7 and 9 can be implemented in combination to provide ribs protruding both upward and downward. The ribs can have a hollow space with sealed top and bottom, with bottom openings, with top openings, or with both top and bottom openings, which are all within the spirit of the present invention.

The present invention also provides a method of making a micro-electro-mechanical device, which includes: providing a substrate; forming an electrode on or above the substrate and a plurality of vent holes in the electrode; forming a spacer on the substrate; and forming a diaphragm connected to the spacer to form a capacitor with the electrode, and forming a plurality of ribs protruding upward and/or downward from the diaphragm which are respectively disposed in correspondence to the vent holes, wherein the ribs do not contact the electrode and do not overlap the electrode from top view.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the ribs can include more via layers and metal layers such as three via layers and three metal layers. For another example, the number of the via and metal layers of the ribs can be different from one another, for example, the number of the layers of the ribs near the center region is higher than the number of the layers of the ribs near the peripheral region. Besides, an embodiment or a claim of the present invention does not need to attain or include all the objectives, advantages or features described in the above. The abstract and the title are provided for assisting searches and not to be read as limitations to the scope of the present invention. Therefore, the scope of the present invention should cover all the variations and modifications.

What is claimed is:

1. A micro-electro-mechanical device, comprising:
a substrate, a first metal layer above the substrate, a via layer above the first metal layer, and a second metal layer above the via layer;
an electrode, including a plurality of vent holes; and
a diaphragm, including a planar layer and a plurality of ribs, wherein the planar layer is disposed above and in parallel to the electrode to form a capacitive sensor with the electrode, and the ribs protrude upward and/or downward from the planar layer such that the ribs are respectively disposed in correspondence to the vent holes, wherein the ribs are smaller than and within the vent holes from a top view having a direction normal to the substrate, such that the ribs do not contact the electrode and do not overlap the electrode from the top view;
wherein each of the ribs at least includes the via layer and the second metal layer which are located in correspondence to the vent holes and are stacked such that a whole interface between the via layer and the second metal layer is in parallel to the planar layer, and the via layer and the second metal layer are different layers from the planar layer and do not belong to a part of the planar layer.

2. The micro-electro-mechanical device of claim 1, wherein the ribs are made of a conductive material including metal, metallic compound, conductive polymer, polysilicon or a combination thereof.

3. The micro-electro-mechanical device of claim 1, wherein the electrode includes a portion of the first metal layer and a portion of the substrate.

4. The micro-electro-mechanical device of claim 1, wherein the via layer is made of a conductive material and includes an internal space which is a hollow space or filled with a dielectric material.

5. The micro-electro-mechanical device of claim 1, wherein at least one of the ribs includes a bottom opening or a top opening.

6. The micro-electro-mechanical device of claim 1, wherein the ribs near a center region of the diaphragm have a relatively higher density than the ribs near a peripheral region of the diaphragm.

7. The micro-electro-mechanical device of claim 1, wherein the vent holes near a center region of the electrode have a relatively larger size than the vent holes near a peripheral region of the electrode.

8. The micro-electro-mechanical device of claim 1, further including a spacer to define an area of the diaphragm; and a supporting ring encompassing the diaphragm and disposed between a periphery of the diaphragm and the spacer.

9. The micro-electro-mechanical device of claim 8, wherein the supporting ring encompasses the diaphragm in a continuous form or the supporting ring encompasses the diaphragm with regular or irregular intervals.

10. A method of making micro-electro-mechanical device, comprising:
providing a substrate, a first metal layer above the substrate, a via layer above the first metal layer, and a second metal layer above the via layer;
forming an electrode having a plurality of vent holes;
forming a spacer on the substrate; and
forming a diaphragm which includes a planar layer and a plurality of ribs, wherein the planar layer is connected to the spacer so that the diaphragm forms a capacitor sensor with the electrode, and the ribs protrude upward and/or downward from the planar layer such that the ribs are respectively disposed in correspondence to the vent holes, wherein the ribs are smaller than and within the vent holes from a top view having a direction normal to the substrate, such that the ribs do not contact the electrode and do not overlap the electrode from the top view;
wherein each of the ribs at least includes the via layer and the second metal layer which are located in correspondence to the vent holes and are stacked such that a whole interface between the via layer and the second metal layer is in parallel to the planar layer, and the via layer and the second metal layer are different layers from the planar layer and do not belong to a part of the planar layer.

11. The method of claim 10, wherein the ribs are made of a conductive material including metal, metallic compound, conductive polymer, polysilicon, or a combination thereof.

12. The method of claim 10, wherein the electrode includes a portion of the first metal layer and a portion of the substrate.

13. The method of claim 10, wherein the via layer is made of a conductive material and includes an internal space which is a hollow space or filled with a dielectric material.

14. The method of claim 10, wherein at least one of the ribs includes a bottom opening or a top opening.

15. The method of claim 10, wherein the ribs near a center region of the diaphragm have a relatively higher density than the ribs near a peripheral region of the diaphragm.

16. The method of claim 10, wherein the vent holes near a center region of the electrode have a relatively larger size than the vent holes near a peripheral region of the electrode.

17. The method of claim 10, wherein the spacer defines an area of the diaphragm, and the method further comprises:
forming a supporting ring encompassing the diaphragm and disposed between a periphery of the diaphragm and the spacer.

18. The method of claim 17, wherein the supporting ring encompasses the diaphragm in a continuous form or the supporting ring encompasses the diaphragm with regular or irregular intervals.

* * * * *